United States Patent [19]

Lemnios et al.

[11] Patent Number: 4,494,997
[45] Date of Patent: Jan. 22, 1985

[54] ION IMPLANT MASK AND CAP FOR GALLIUM ARSENIDE STRUCTURES

[75] Inventors: Zachary J. Lemnios, Bowie; He B. Kim, Pasadena, both of Md.

[73] Assignee: Westinghouse Electric Corp., Pittsburgh, Pa.

[21] Appl. No.: 504,568

[22] Filed: Jun. 15, 1983

[51] Int. Cl.$^3$ .......................................... H01L 21/265
[52] U.S. Cl. .................................. 148/1.5; 29/576 B; 29/578; 357/61; 148/191
[58] Field of Search .............. 29/578, 576 B; 148/191, 148/1.5; 136/261; 156/662; 357/61

[56] References Cited

U.S. PATENT DOCUMENTS 4,267,014  5/1981  Davey et al. ....................... 156/662

OTHER PUBLICATIONS

Kasahara et al., "Capless Anneal of Ion-implanted GaAs in Controlled Arsenic Vapor", J. Appl. Phys., vol. 50, No. 1, Jan. 79, pp. 541–543.
Anderson, Jr. et al., "Smooth & Continuous Ohmic Contacts to GaAs Using Epitaxial Ge Films", J. Appl. Phys., vol. 49, No. 5, May 78, pp. 2998–3000.
Nagai et al., "New Application of Se-Ge Glasses to Silicon Microfabrication Technology", Applied Phys. Letters, vol. 28, No. 3, Feb 76, pp. 145–147.
Balasubramanyam, "An Inorganic Resist for Ion Beam Microfabrication", J. Vac. Sci. Technol., vol. 19, No. 1, June 1981, pp. 18–22.

Primary Examiner—Brian E. Hearn
Assistant Examiner—Nathan Thane
Attorney, Agent, or Firm—W. G. Sutcliff

[57] ABSTRACT

A mask and encapsulating layer suitable for use on gallium arsenide substrates is described incorporating a layer of germanium selenide which is photosensitive and may be exposed and developed to form a mask suitable for ion implantation and which may also remain as a capping layer during an anneal process of ion implanted regions in a controlled atmosphere and temperature furnace wherein the layer of germanium selenide is converted to germanium which may subsequently be removed from the gallium arsenide substrate after the step of annealing.

5 Claims, 6 Drawing Figures

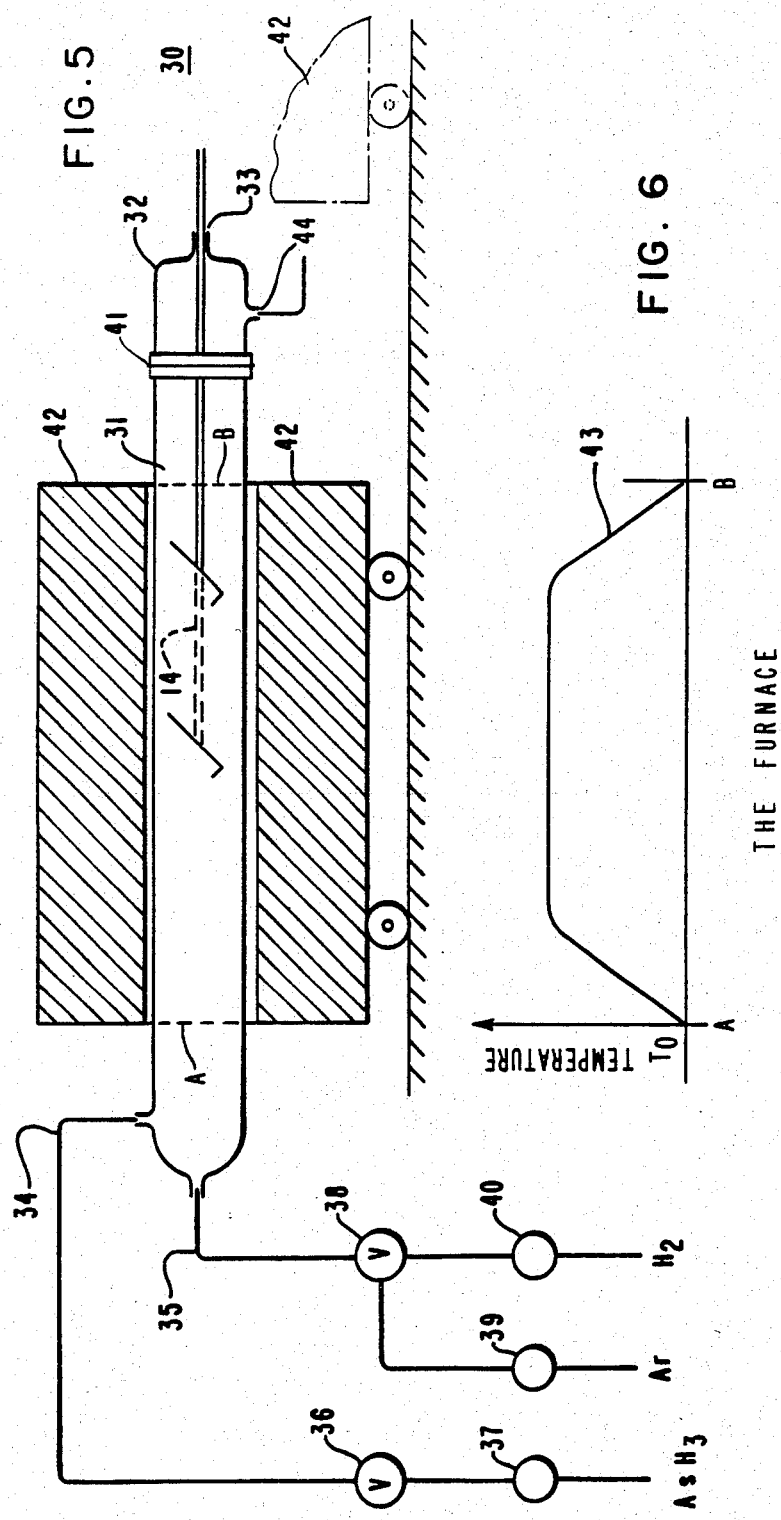

ION IMPLANT MASK AND CAP FOR GALLIUM ARSENIDE STRUCTURES

BACKGROUND OF THE INVENTION

1. Field of the Invention:

This invention relates to semiconductor devices and more particularly to an ion implant mask and cap during anneal for fabricating submicron gallium arsenide structures.

2. Description of the Prior Art:

In the prior art, fabrication of gallium arsenide structures may begin by applying an organic photoresist layer on the upper surface of a gallium arsenide substrate and patterning it in an appropriate manner to form, for example, a field effect transistor (FET) active layer mask. The next step is to ion implant impurities through the photoresist mask where there are windows or openings to form a doped region extending from the surface of the gallium arsenide substrate to a predetermined depth. The photoresist layer is subsequently removed and a capping layer is deposited over the gallium arsenide substrate.

The material of a capping layer may, for example, be silicon nitride, silicon oxide, phosphorus-doped silicon oxide or aluminum nitride. The purpose of the capping layer is to reduce the outgassing of arsenic from the gallium arsenide substrate when the ion implanted region is annealed. The ion implanted region is annealed by raising the gallium arsenide substrate to a high temperature such as 800° C. to permit recrystallization of the gallium arsenide damaged by the ion implantation. During recrystallization, substitution of the ion implanted ions into the crystal lattices of the gallium arsenide material occurs. After the ion implanted region is annealed, a step also called activation, the capping layer is removed and further processing continues. This includes the formation of ohmic contacts defining drain and source and deposition of material suitable to form the gate of a field effect transistor.

Other materials suitable as a capping layer to prevent outgassing of arsenic from a gallium arsenide substrate during annealing are described in U.S. Pat. No. 4,267,014 which issued on May 12, 1981 to J. E. Davey, A. Christou and H. B. Dietrich. In U.S. Pat. No. 4,267,014 a method for protecting an ion implanted substrate during the annealing process is described by covering the ion implanted layer with a suitable encapsulant such as a germanium, amorphous gallium arsenide, doped gallium arsenide, or gallium aluminum arsenide. The protective capping layer is applied subsequent to the step of ion implantation. After the step of annealing, the capping layer is removed by selective chemical etching.

In U.S. Pat. No. 4,058,413 which issued on Nov. 15, 1977 to B. M. Welch and R. D. Pashley, a method to prevent dissociation of gallium arsenide during the step of annealing was described using a capping layer of aluminum nitride which was sputtered onto the gallium arsenide substrate.

In U.S. Pat. No. 4,330,343 which issued on May 18, 1982 and in U.S. Pat. No. 4,263,605 which issued on Apr. 21, 1982 both to A. Christou and J. E. Davey, a method of forming a low ohmic contact on gallium arsenide material was described by depositing a refractory material such as titanium tungsten (TiW) and ion implanting impurities such as silicon, selenium or germanium through the layer of TiW. The layer of TiW also functions as a capping layer when annealing the implanted structure to activate the implanted ions. Other materials suggested as a refractory material include tantalum, tungsten, platinum, and molybdenum to a thickness of from 400 to 800 Angstroms.

In U.S. Pat. No. 4,354,198 which issued on Oct. 12, 1982 to Rodney T. Hodgson et al., a capping layer of zinc-sulphide is sputtered to a thickness of 500 Angstroms onto a GaAs surface. The GaAs surface is heated with a laser beam which does not directly heat the zinc-sulphide. The zinc-sulphide or group II-VI compound semiconductor acts as a surface passivator to reduce or control the recombination of charge carriers at the surface of GaAs or other group III-V compound semiconductors.

In a paper entitled "New Application of Se-Ge Glasses to Silicon Microfabrication Technology" by H. Nagai et al. and published in Applied Physics Letters, Vol. 28, No. 3, Feb. 1, 1976, pp. 145–147, a film of $Se_{75}Ge_{25}$ on a silicon substrate was selectively etched by an alkaline solution. A mercury lamp was used as a light source where the wavelength of the lamp is shorter than the absorption edge of Se-Ge. SeGe was used as a photoresist on silicon, silicon dioxide and silicon nitride. The application of Se-Ge glass films to the patterning of layers for silicon device processing and for the fabrication of photo masks were investigated.

In a paper entitled "A Novel Inorganic Photoresist Utilizing Ag Photodoping in Se-Ge Glass Films" by Akira Yoshikawa et al. and published in Applied Physics Letters, Vol. 29, No. 10, Nov. 15, 1976 pp. 667–679, a photoetching procedure is described using an Se-Ge film for positive or negative photographic sensitivity. The negative resist would include the additional process steps of depositing a thin Ag layer over the Se-Ge film prior to photoexposure followed by developing in an acid solution to remove the Ag remaining on the unexposed area. The Se-Ge film would be etched by an alkaline solution.

In a paper entitled "Bilevel High Resolution Photolithographic Technique for Use with Wafers with Stepped and/or Reflecting Surfaces" by K. L. Tai et al. and published in J. Vac. Sci. Technol., 16 (6), Nov./Dec. 1979, pp. 1977–1979, a tri-level system is described comprising $Ag_2Se/GeSe_2$ over a thick organic polymer resistor a bi-level system is described comprising GeSe over a thick organic polymer. The polymer may be etched using the GeSe as a mask in an $O_2$ plasma. The thick polymer provides a flat surface necessary for high resolution and good line-width control over a wafer surface which may have steps raised as high as 1 $\mu m$ above the plane of the wafer surface.

In a paper entitled "Dry Development of Se-Ge Inorganic Photoresist" by Akira Yoshikawa et al. and published in Appl. Phys. Lett. 36 (1), Jan. 1, 1980, pp. 107–109, a Se-Ge inorganic resist (chalcogenide glass film) is described where plasma etching results in a large etch-rate difference between Ag photodoped and undoped films. A plasma etch rate of undoped to Ag-doped $Se_{75}Ge_{25}$ films of 370 to 1 was observed with $CF_4$ as the plasma source gas.

In a paper entitled "Submicron Optical Lithography Using An Inorganic Resist/Polymer Bi-Level Scheme" by K. L. Tai et al. and published in J. Vac. Sci. Technol., Vol. 17, No. 5, Sept./Oct. 1980, pp. 1169–1176, an inorganic photoresist system is described. The inorganic resist consists of two layers, about 100

Angstroms Ag$_2$Se on about 2000 Angstroms GeSe. Upon illumination by light, Ag in the Ag$_2$Se layer is photodoped into the GeSe layer. Ag doped GeSe is less soluble or insoluble in the developer. A bi-level resist of GeSe over HPR206 polymer is also shown in FIG. 5 over a polysilicon level of a 16K MOS RAM wafer.

It is, therefore, desirable to provide an inorganic photosensitive material amenable to high resolution such as submicron resolution which may be deposited on a gallium arsenide substrate and also function as an ion implant mask.

It is further desirable to provide a new material, germanium selenide (Ge$_x$Se$_{1-x}$) with respect to gallium arsenide which is photosensitive to form an ion implant mask.

It is further desirable to provide a new material to form a capping material on gallium arsenide material during times when ion implanted gallium arsenide is annealed at high temperature.

It is further desirable to use germanium selenide as both an ion implant mask and as a capping layer over gallium arsenide material.

It is further desirable to reduce the number of processing steps in the fabrication of gallium arsenide semiconductor devices.

It is further desirable to provide photosensitive material capable of delineating ion implant masking geometries as small as 0.37 micrometers.

SUMMARY OF THE INVENTION

In accordance with the present invention, apparatus and methods are described for fabricating an ion implant mask out of germanium selenide on a gallium arsenide substrate wherein the germanium selenide layer may be selectively sensitized, exposed and developed to form the ion implant mask.

The invention further provides an apparatus and method for capping a gallium arsenide substrate by depositing a layer of germanium selenide over the substrate.

The invention further provides a photosensitive material which may be developed to form a positive or negative ion implant mask and also a capping material over a gallium arsenide substrate.

BRIEF DESCRIPTION OF THE DRAWING

FIG. 5 is a diagram of a controlled atmosphere and temperature (CAT) furnace.

FIG. 6 shows a typical temperature profile suitable for the furnace of FIG. 5.

DESCRIPTION OF THE PREFERRED EMBODIMENT

Figure 1:
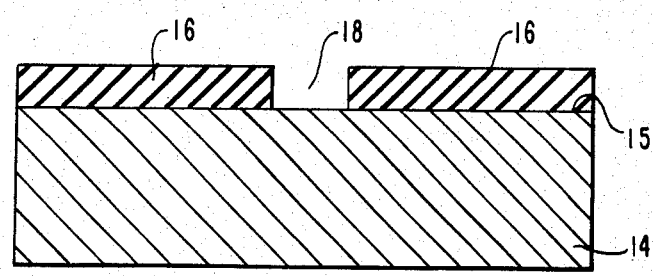
FIGS. 1-4 show a cross section diagram illustrating the embodiment of the invention and process steps.

In FIG. 1 gallium arsenide substrate 14 is shown having an upper surface 15. Typically, a 2000 Angstrom layer of germanium selenide (Ge$_x$Se$_{1-x}$) 16 is deposited by dual thermal techniques on upper surface 15 of gallium arsenide substrate 14. The dual-filament deposition method and film stoichiometry are well known by those in the art. Typical film stoichiometry is Ge$_{0.1}$Se$_{0.9}$ where this stoichiometry is established by dual-filament or co-sputter thin-film techniques.

The dual-filament deposition method involves co-depositing elemental germanium and elemental selenium in an evaporator. The stoichiometry is established by varying the filament temperature as determined by the vapor pressure of each constituent.

The co-sputter deposition method involves co-depositing elemental germanium and elemental selenium in a sputter system. Here the stoichiometry is established by varying the sputter target power as determined by the sputter yield of each constituent.

In each case, the Ge$_x$Se$_{1-x}$ layer is optimized by adjusting the stoichiometry (either through deposition filament temperature or sputter target power), film thickness and purity.

The germanium selenide film 16 is sensitized and selectively exposed by well-known methods. The exposed layer 16 is developed wherein material exposed is removed to form window or opening 18 as shown in FIG. 1. The maximum distance across window 18 may be as small as 0.37 micrometers by optimizing the germanium selenide stoichiometry process and exposure method.

Figure 2:
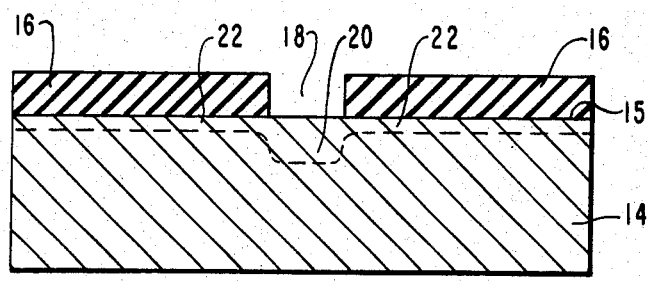

The germanium selenide layer 16 with window 18 may now function as a mask for ion implantation with the proper species such as silicon, energy and fluence to form n-type region 20 extending from upper surface 15 into gallium arsenide substrate 14 below window 18 as shown in FIG. 2. N-type region 20 is formed by direct ion implantation. In addition to region 20, region 22 below germanium selenide layer 16 can be selectively formed to be n− type or n+ type by proper selection of implant conditions which includes the ion mass, energy, and fluences and resultant level of recoil doping. It is understood that region 22 is formed by implanting ions through germanium selenide layer 16.

Alternately, region 22 may be formed by depositing an encapsulant over germanium selenide layer 16 followed by a flash diffusion of selenium from germanium selenide layer 16 through upper surface 15 into gallium arsenide substrate 14. By this method an n− type or n+ type region 22 may be formed.

The selenium flash diffusion process is known as a recoil doping technique. That is, when a $^{29}$Si$^+$ species is implanted through the Ge$_x$Se$_{1-x}$ layer at 400 KeV it will "recoil" a $^{80}$Se$^+$ species into the host substrate. It is this Se$^+$ species that forms the shallow n+ implant area.

Figure 3:
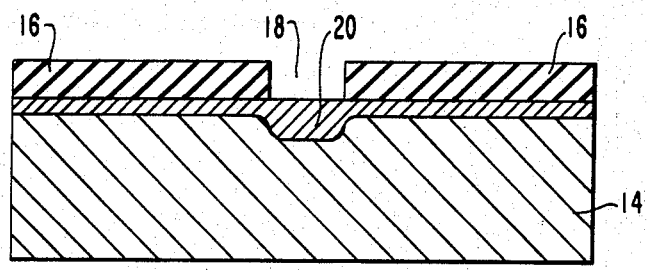

N-type regions 20 and 22 are annealed as shown in FIG. 3 with germanium selenide layer 16 remaining as a capping layer. The annealing of regions 20 and 22 are done in a controlled atmosphere technique (CAT) system, a diagram of which is shown in FIG. 5.

Referring to FIG. 5, a CAT system 30 is shown having a housing or chamber 32 having an opening 33 and decoupling joint 31 suitable for inserting a substrate 14 of gallium arsenide material. Opening 44 functions to vent gas from chamber 32. Chamber 32 is supplied with gas by gas supply tubes 34 and 35. Tube 34 is coupled to a valve 36 and through mass flow controller (MFC) 37 to a source of gas having the compound AsH$_3$. Tube 35 is coupled through valve 38 to MFC 39 and to MFC 40 which in turn are coupled to a gas supply of Ar and H$_2$ respectively. Valve 38 may be a two-way valve. Tubes 34 and 35 supply gas to housing 32 which is vented through opening 44 resulting in a controlled atmosphere being developed within housing 32 depending upon the flow rate of the gasses, furnace temperature and composition of the gas from tubes 34 and 35. Around chamber 32 may be a six-zone furnace 42 shown in cross section.

Referring to FIG. 6 curve 43 shows a typical temperature profile for a six-zone furnace 42. In FIG. 6 the ordinate represents temperature and the abscissa represents distance X along furnace 42.

During the step of annealing regions 20 and 22 in gallium arsenide substrate 14, the atmosphere within housing 32 contains an excess over pressure of arsenic generated from supply tube 34 by the decomposition of its supply gas AsH$_3$. The excess arsenic in gas chamber 32 prevents loss of arsenic through window 18 shown in FIG. 3 from gallium arsenide substrate 14 during the entire annealing heat treatment cycle in chamber 32. The annealing cycle and gas flow conditions in chamber 32 of furnace 30 are well known and documented in publications.

In a typical annealing cycle, GaAs substrate is placed in the cool region of the chamber 32 under Ar flow, sealed with joint 41, flushed (greater than 1000 SCCM) at high flow rate by H$_2$ from tube 35 to displace all Ar gas from the chamber 32, exposed under the excess As (0.01 to 1 atm) generated from the AsH$_3$ introduced from tube 34 at a flow rate of 1-2 cm/sec through the chamber 32, which is heated up to 850° C. for example for 30 minutes, then retracted to the cool region and removed under AR atmosphere at room temperature by decoupling the sealed joint 41.

In a typical example, gallium arsenide substrate 14 will reach 850° C. steady state temperature in one minute from room temperature. At the temperature of 850° C., the selenium in germanium selenium layer 16 will evaporate during the annealing cycle in chamber 32 due to the high vapor pressure of selenium at 850° C. The evaporation of selenium will transform the germanium selenium layer 16 to an elemental germanium layer 48 during the 30-minute anneal.

Figure 4:
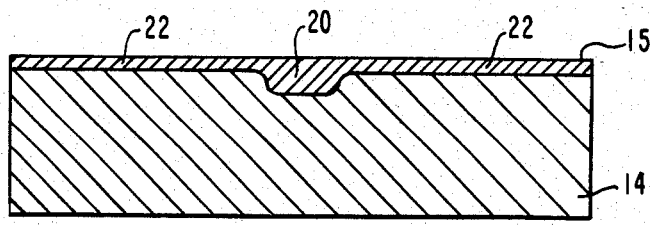

Following the step of annealing regions 20 and 22 in CAT system 30, germanium layer 48 which was previously germanium selenium layer 16 may be plasma etched by well-known techniques. FIG. 4 shows the resultant structure with germanium layer 48 removed which leaves exposed regions 20 and 22 extending from upper surface 15 into gallium arsenide substrate 14.

The percent of activation of regions 20 and 22 may be controlled by properly adjusting the anneal process in furnace 30 and the germanium selenium film thickness.

To properly adjust the anneal process of CAT anneal conditions, the temperature, anneal time and the excess As atmosphere can be adjusted to control the percent activation of implanted species in regions 20 and 22 to be electrically active donors or acceptors.

An apparatus and method has been described for forming a photosensitive mask on a gallium arsenide substrate which may be developed to provide feature sizes as small as 0.37 micrometers and through which ion implantation may occur.

Further, a layer of germanium selenium which was previously used as a mask for ion implantation may be subsequently used as a capping layer to prevent outgassing of arsenic during an anneal process wherein the gallium arsenide is placed in a furnace having a controlled atmosphere including an arsenic vapor pressure.

Further, the layer of germanium selenide may be converted to elemental germanium by vaporizing the selenium. The germanium layer may be removed by plasma etching.

We claim:

1. A method for fabricating doped regions in a gallium arsenide substrate comprising the steps of depositing a layer of germanium selenide over a substrate of gallium arsenide, exposing the layer of germanium selenide to a predetermined pattern, developing the exposed layer of germanium selenide to provide openings in the layer of germanium selenide, ion implanting impurities through said openings to form first ion implanted regions, ion implanting impurities of a second concentration through the layer of germanium selenide to form second ion implanted regions, annealing first and second ion implanted regions, converting the layer of germanium selenide to a layer of germanium, and removing the layer of germanium.

2. The method of claim 1 wherein the step of annealing further includes raising the temperature of said gallium arsenide substrate and said germanium selenide layer to 850° C.

3. The method of claim 1 wherein said step of annealing further includes annealing in a controlled atmosphere wherein said atmosphere includes a predetermined arsenic vapor pressure.

4. The method of claim 1 wherein said step of converting said layer of germanium selenide to germanium includes heating said layer of germanium selenide to a temperature to permit substantial evaporation of selenium from the layer of germanium selenide.

5. The method of claim 1 further including the step of forming ohmic contacts to selected ion implanted regions.

* * * * *